United States Patent [19]
Hohmann et al.

[11] Patent Number: 5,036,216
[45] Date of Patent: Jul. 30, 1991

[54] VIDEO DOT CLOCK GENERATOR

[75] Inventors: Jere W. Hohmann, Doylestown; Bruce J. Rogers, Collegeville; Stephen A. Ransom, Huntingdon Valley; Daniel M. Clementi, Doylestown, all of Pa.

[73] Assignee: Integrated Circuit Systems, Inc., Valley Forge, Pa.

[21] Appl. No.: 490,784

[22] Filed: Mar. 8, 1990

[51] Int. Cl.$^5$ ............................................. H03L 7/8
[52] U.S. Cl. ................................ 309/269; 331/1 R; 331/25; 307/262
[58] Field of Search ................ 331/1 R, 25, 18; 307/262, 271, 269; 328/155

[56] References Cited

U.S. PATENT DOCUMENTS

| | | | |
|---|---|---|---|
| 4,063,484 | 12/1977 | Robinson | 331/25 |
| 4,068,198 | 1/1978 | Otto | 331/25 |
| 4,320,515 | 3/1982 | Burton, Jr. | 307/269 |
| 4,447,792 | 5/1984 | Wynn | 331/18 |
| 4,654,859 | 3/1987 | Kung et al. | 331/18 |
| 4,670,888 | 6/1987 | Smith, III | 331/1 R |
| 4,777,655 | 10/1988 | Numata et al. | 331/25 |
| 4,801,896 | 1/1989 | Phillips et al. | 331/1 R |
| 4,864,634 | 9/1989 | Nakagawa et al. | 331/25 |
| 4,868,524 | 9/1989 | Costlow | 331/25 |
| 4,896,337 | 1/1990 | Bushy, Jr. | 328/155 |

FOREIGN PATENT DOCUMENTS 0135120 5/1989 Japan ............................. 331/1 R

OTHER PUBLICATIONS

The Cambridge Univ. Press., P. Horowitz et al., "The Art of Electronics" 1983 pp. 428–436.
PC Magazine, A. Poor, "16-bit VGA Cards Stretch The Standard" Jul., 1989 pp. 145–150.
Specification of ATI Clock Generation Integrated Circuit May 31, 1988.
Specification of National Semiconductor DP8512 Video Clock Generator, 1989.

Primary Examiner—Stanley Miller
Assistant Examiner—Scott A. Ouellette
Attorney, Agent, or Firm—Ratner & Prestia

[57] ABSTRACT

A video dot clock generator includes a phase-locked loop (PLL) which includes a voltage controlled oscillator, a frequency divider, a phase comparator and a loop filter. The voltage controlled oscillator (VCO) is programmable to provide multiple frequency ranges for a given range of control voltages applied to the oscillator. The programming affects both the frequency range and the gain of the VCO. The phase comparator includes circuitry which simulates a predetermined minimum phase error which, when compensated for, substantially eliminates jitter in the dot clock signal. The frequency divider used in the PLL and a similar frequency divided used to generate the reference signals for the phase comparator are programmable via an internal memory which also holds programmable control signals for the VCO. The memory, in turn, may be programmed by the user to achieve desired frequency and loop again characteristics for a given application.

15 Claims, 6 Drawing Sheets

VIDEO DOT CLOCK GENERATOR

FIELD OF THE INVENTION

The present invention relates to clock generation circuitry for use with high-performance video graphics equipment and particularly to an integrated circuit incorporating such circuitry which may be programmed to provide clock signals over a relatively wide range of frequencies.

BACKGROUND OF THE INVENTION

Modern data processing equipment utilize video display devices which provide a wide range of picture element (pixel) resolutions. For example, a computer graphics adapter (CGA) video interface card for an IBM-compatible personal computer provides a video image having 64,000 (320×200) pixel or dot positions in each displayed image, while a high-resolution 1k variable graphics adapter (VGA) video interface card provides 786,432 (1,024×768) pixel positions. Each of these video images is displayed in about the same amount of time, consequently, the frequency of the clock signal used to display the 1k VGA image is approximately twelve times that of the signal used to display the CGA image. In addition, there are other computer graphic interfaces which provide even greater resolution and thus, employ even higher-frequency dot clock signals.

In some computer graphics applications, it may be desirable to provide several levels of resolution. For example, a relatively low resolution display format may be preferred for preparing text or for determining image layout, since the smaller number of pixels in the image may translate to less elapsed time to generate or change the image. However, a relatively high-resolution display format may be preferred for applications such as desktop publishing in which high-quality text may be combined with high-resolution graphic images.

A VGA interface card, such as the VGA Wonder ™ available from ATI Technologies Inc., is compatible with several video graphic display formats including CGA, EGA (640×350), VGA (640×480), Super VGA (800×600) and 1k VGA. In addition, the interface card supports text display formats having fewer pixels per screen image that even CGA. A flexible video interface of this type may use several different pixel clock signals having frequencies that range from approximately 100 MHz for the 1k VGA format to approximately 20 MHz for the CGA and text display formats.

Many of the currently available video display interface cards employ several clock oscillators or several resonant crystals with a single oscillator to produce these different clock frequencies. This duplication of circuitry increases the complexity and cost to the video display card over that of a card which employs a single oscillator having a single resonant crystal.

One clock generator integrated circuit (IC) which uses only a single crystal to provide multiple clock frequencies is the ATI8900, also available from ATI Technologies Inc. Using a 14.31818 MHz resonant crystal, this integrated circuit may be programmed to provide ten internally generated clock signals ranging in frequency between 28.322 MHz and 44.9 MHz. However, this IC does not generate the 100 MHz clock signals used for the high-resolution displays. Clock signals at these frequencies are generated externally and channeled through the IC via three input terminals.

Another clock signal generator IC is the Dp8512 manufactured by National Semiconductor Corporation. This IC produces multiple synchronous clock signals having different frequencies. These clock signals are produced simultaneously and are used to drive different components of a video graphics display system. All of these signals are referenced to a single clock signal, the frequency of which defines the pixel resolution of the video display. The IC may provide pixel clock signals having frequencies of up to 225 MHz. The frequency of the clock signal provided by this IC may be set by programming two internal counters which are configured with a voltage controlled oscillator (VCO), phase detector and loop filter in a phase locked loop (PLL) arrangement. The frequency of the signal produced by the VCO is determined by an external capacitor and Varactor diode, as well as by an external resonant crystal.

The VCO's in both of these IC's operate effectively in their respective PLL's only over a limited range of frequencies. This limited range occurs because the changes to the VCO circuitry or to its control voltage which tend to change its free-running frequency also tend to change its gain. The gain of the VCO combined with the gains of the other components of the PLL determine the response time of the PLL to a phase error. Thus, to accommodate applications which may require differing response times, it may be desirable to modify other components of the PLL to achieve a desired overall loop gain. In some instances the desired loop gain may not be realizable due to limitations of the other components or due to interfering noise signals.

Both of the clock signal generation IC's described above use external feedback capacitors in the circuitry for their respective VCO's. This is disadvantageous since the external capacitor uses two connecting pins on the IC and since it provides an entry point for interfering electrical signals (i.e. noise) which may affect the stability of the pixel clock signal.

SUMMARY OF THE INVENTION

The present invention is embodied in a clock generator realized as an integrated circuit which uses a single reference oscillatory signal and is programmable for generating clock signals at several different frequencies. The integrated circuit includes a phase-locked loop having a voltage controlled oscillator with an integral feedback capacitance, a programmable frequency divider and a phase comparator. The frequency divider includes a programmable prescaler and a separately programmable counter. The phase comparison circuitry may provide an output signal having either a normal or inverted polarity. When the frequency of the signal produced by the clock generator is switched, the internal state of the phase comparison circuitry is set to indicate no error and its output signal is set to a high-impedance state.

In another aspect of the invention, an operational amplifier is included in the integrated circuit. This amplifier may be coupled into the phase-locked loop to implement a loop filter or it may be excluded from the loop when an external filter is preferred.

In yet another aspect of the invention, the phase comparison circuitry includes circuitry which produces a fixed minimum phase error signal when the PLL is in a locked state.

In a further aspect of the invention, the VCO includes circuitry for changing its gain to operate in multiple frequency bands.

DETAILED DESCRIPTION

Overview

Figure 1:
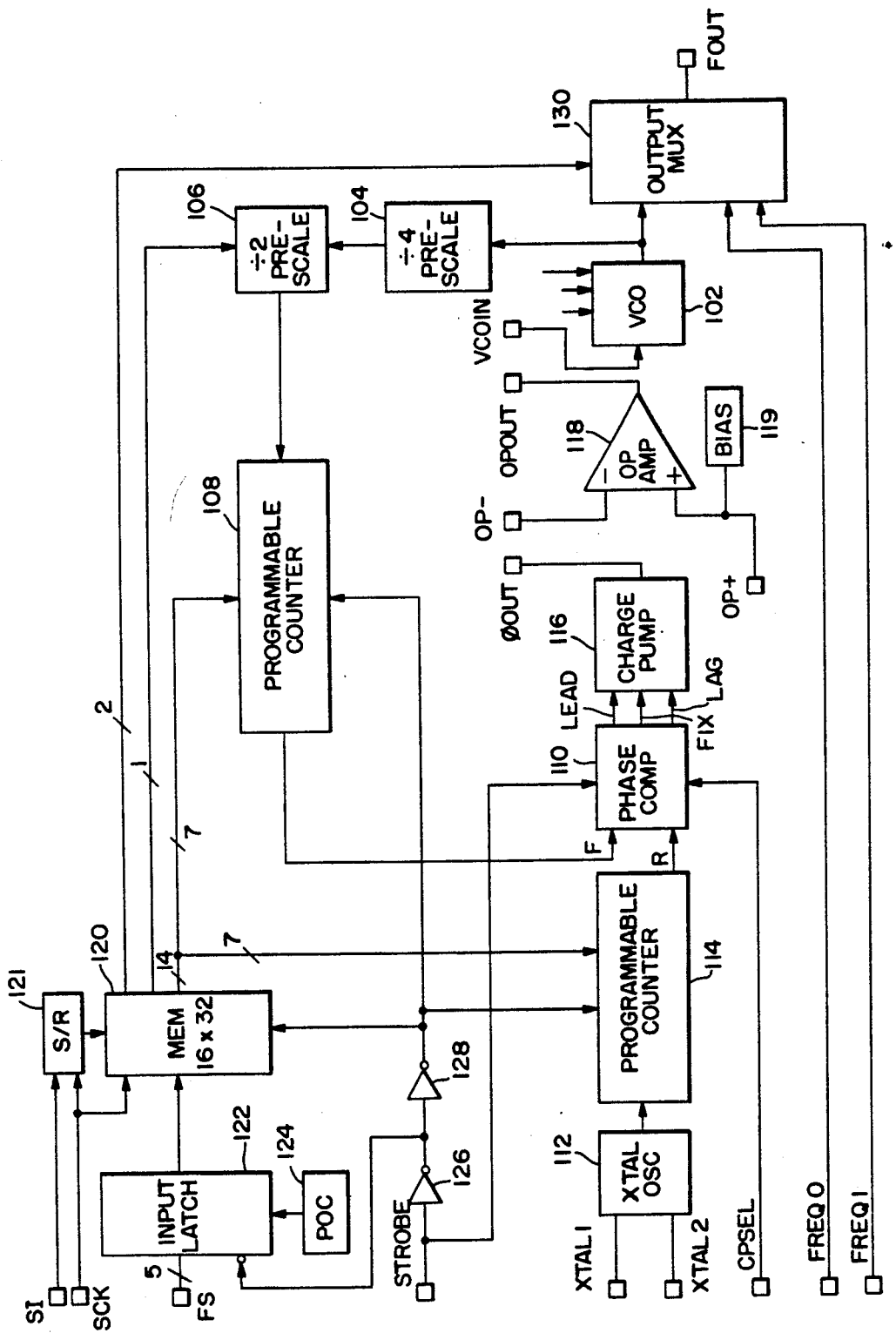
FIG. 1 is a block diagram of an integrated circuit which includes an embodiment of the invention.

Referring to FIG. 1, an exemplary clock generator in accordance with the present invention may include a phase-locked loop (PLL), having VCO 102 and a programmable frequency divider 108 in its feedback loop, and an internal reference signal oscillator 112 coupled to a second programmable frequency divider 114. The frequency of the output signal produced by the PLL is controlled by the selection of a resonant crystal used with the oscillator and by the division ratios provided by the two frequency dividers.

These division ratios are programmable to provide, in this embodiment of the invention, up to 32 different frequencies. This programming is accomplished via a programmable memory 120 coupled to the circuit. A particular frequency is selected by addressing the memory 120 and then activating a signal, STROBE, to load the frequency division ratios, represented by the contents of the addressed memory location, into the two frequency dividers. Although the exemplary embodiment of the invention includes space in the memory 120 for 32 different sets of parameters, each defining a distinct frequency-gain combination, it is contemplated that other memory sizes may be used. If a different memory size is used it may be desirable to change the number of address pins on the integrated circuit.

The frequency of the signal produced by the circuit is the frequency of the resonant crystal multiplied by the feedback divide ratio and divided by the input divide ratio.

The frequency-divided reference signal provided by the counter 114 and the frequency-divided feedback signal from the counter 108 are applied to phase comparison circuitry which includes a phase comparator 110 and a charge pump 116. The phase comparison circuitry produces an error signal which is processed by a loop filter (not shown) to produce a control voltage for the VCO 102.

DETAILED DESCRIPTION OF THE PREFERRED EMBODIMENT

The central element in the circuit shown in FIG. 1 is the PLL which comprises the VCO 102, a feedback frequency divider including prescalers 104 and 106 and the programmable down-counter 108, a phase comparator 110, a charge pump 116 and, optionally, an operational amplifier 118.

This PLL operates as follows. The VCO 102, which may include, for example, a current controlled ring oscillator, generates a signal having a frequency determined by a potential applied to its input terminal VCOIN and by its present gain setting. The gain of the VCO may be set in small steps by a digital value applied to the two input terminals D0 and D1. It may also be modified in a larger step by a signal applied to the terminal SLOW. The signals applied to the terminals D0, D1 and SLOW are provided from the memory 120. Exemplary circuitry for the VCO 102 is described below in reference to FIG. 2.

The output signal of the VCO 102 is applied to the prescaler 104 which may include, for example, two cascade connected trigger-type flip flops (not shown). The prescaler 104 divides the frequency of the oscillatory signal applied to its input terminal by four. The output signal of the prescaler 104 is applied to a switchable prescaler 106. The prescaler 106 is responsive to a one-bit control signal provided by the memory 120 to either divide its input signal by two or to pass it unchanged.

The signal provided by the prescaler 106 is applied to a programmable counter 108. The counter 108 used in this embodiment of the invention is a seven-bit downcounter. It loads a seven-bit preset value, provided by the memory 120, synchronous with the externally supplied signal STROBE, or upon reaching a count value of zero. The counter 108 decrements its count value by one for each pulse of the output signal of the prescaler 106. When the count value decrements to zero, the counter 108 produces an output pulse which is applied to the feedback input terminal, F, of the phase comparator 110.

The reference input terminal, R, of the phase comparator 110 is coupled to receive a reference signal provided by a resonant crystal controlled oscillator 112 and a seven-bit down counter 114. The oscillator 112 may be coupled to an external resonant crystal (not shown) via the terminals XTAL1 and XTAL2. Alternatively, as set forth below in reference to FIG. 4, the oscillator may be coupled to an externally supplied oscillatory signal, such as, for example, a bus clock signal.

The down counter 114, which may be identical to the counter 108, receives a seven-bit count-down value from the memory 120 and provides its output pulse to the reference input terminal of the phase comparator 110.

The phase comparator 110 produces three output signals, LEAD, FIX and LAG. The signal LEAD is active for the amount of time that the transitions of the feedback signal precede corresponding transitions of the reference signal. In the present embodiment of the invention, when the PLL is in a locked state, the duration of the signal LEAD does not go to zero. It is limited to being at least a minimum duration defined by the fixed duration signal FIX. The signal LAG is active for the amount of time that the transitions of the feedback signal follow the transitions of the reference signal.

The signals LEAD, FIX and LAG are applied to a charge pump 116 which acts as a current source when the signals LEAD or FIX are active and as a current sink when the signal LAG is active. The charge pump 116 provides this output signal via an output terminal $\phi_{OUT}$. The signal $\phi_{OUT}$ is applied to a loop filter (not shown) which may be implemented with passive or active components external to the IC or it may utilize the operational amplifier 118 internal to the IC. Exemplary circuitry which may be used for the phase comparator 110 and charge pump 116 and loop filter is described below in reference to FIGS. 3a a through 3c.

If the amplifier 118 is used to implement the loop filter, it may be configured as set forth below in reference to FIG. 4. It may be desirable to use the amplifier 118 to avoid contamination of the control signal for the VCO by sources of electrical interference external to the IC. The input terminal OP+ is internally biased to match the center potential of the signal $\phi_{OUT}$. That is to say, the potential on the terminal $\phi_{OUT}$ when the signals LEAD and LAG are both inactive. The terminal OP+ is biased to provide a virtual ground returned to a source of operational potential, AVDD, which is the operational potential source for the VCO 102. This biasing of the terminal OP+ substantially eliminates ground loop currents external to the IC.

In a typical configuration, the loop filter is a conventional proportional plus integral filter which integrates the phase difference signal provided by the charge pump 116 to produce the control potential which is applied to the VCO 102 via the input terminal VCOIN.

The signal STROBE is pulsed active to change the frequency of the clock signal provided by the IC. When this signal is pulsed, the phase comparator 110 is reset to indicate no phase error (i.e. LEAD, FIX and LAG are all inactive). This causes the output terminal, $\phi_{OUT}$, of the charge pump 116 to exhibit a high-impedance state. Next, a latch 122 is conditioned to load a new address value to be applied to the memory 120. In response to this address value, the memory 120 changes the values of the signals applied to the prescaler 106, the counters 108 and 114 and the VCO 102. When these values have stabilized, the signal STROBE is applied to reset the counters 108 and 114, conditioning them to load the new count values on the trailing edge of the STROBE pulse and to apply the new values of the signals D0, D1 and SLOW to the VCO 102. When the STROBE pulse is inactive, the PLL begins to change its frequency to that indicated by the value provided by the memory 120.

The phase comparator 110 used in this embodiment of the invention is also coupled to receive a signal CPSEL. This signal switches the sense of the signals LEAD and LAG provided by the comparator 110. This facility is provided so that the loop filter used with the clock generation IC may be implemented in an inverting or non-inverting configuration.

In addition to the two seven-bit signals provided to the counters 108 and 114, the one-bit signal provided to the prescaler 106 and the three one-bit signals D0, D1 and SLOW provided to the VCO 102, the memory 120 provides a two-bit signal to an output multiplexer 130. In response to this signal, the multiplexer 130 selects either the output signal of the VCO or one of two external clock signals, applied to terminals FREQ0 and FREQ1, as the output signal of the clock generator IC.

The external signals applied to the terminals FREQ0 and FREQ1 would most commonly be used to synchronize the display system to an externally supplied video signal, such a signal may be produced by a video tape recorder (VTR). The input terminals FREQ0 and FREQ1 may also be used when a clock signal cannot be obtained to a desired level of precision using the programmable frequency dividers or when the frequency of the desired signal is greater than or less than that which may be provided by the circuit in its current configuration. For example, if a 14.31818 MHz resonant crystal were used with the oscillator 112, it may be desirable to provide any clock signals having frequencies less than 450 KHz or greater than 150 MHz through the external input terminals FREQ0 and FREQ1.

It is contemplated that the memory 120 may be implemented as a mask-programmable read only memory (ROM), an electrically erasable programmable read only memory (EEPROM) or as a random access memory (RAM). When the memory 120 is either an EEPROM or a RAM, the values held in the memory may be set by the user using a serial port which includes the terminals SI and SCK.

In the exemplary embodiment of the invention, the memory 120 may be programmed by applying an address value to the terminals FS while the desired data value is serially loaded into a shift register 121 using the serial data and clock input terminals SI and SCK, respectively. The data in the register 121 is stored into the addressed memory cell by activating the signal STROBE while the serial clock signal, applied to the terminal SCK, is active.

Figure 2:
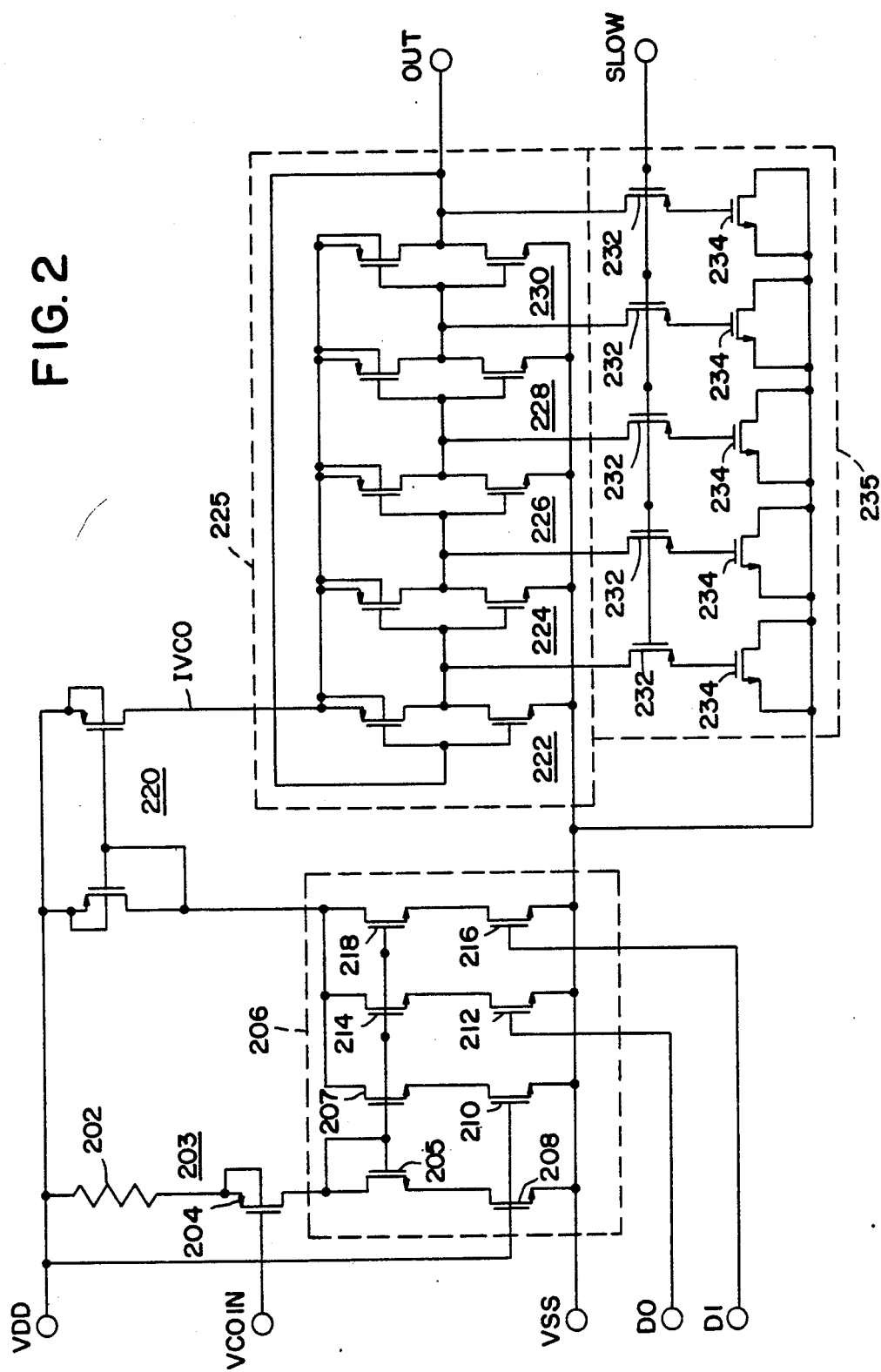
FIG. 2 is a schematic diagram of an exemplary voltage controlled oscillator suitable for use within the integrated circuit shown in FIG. 1.

FIG. 2 is a schematic diagram of circuitry suitable for use as the VCO 102. The VCO includes a conventional current controlled ring oscillator 225 which is coupled to a variable current source 220. The amount of current provided by the source 220, in part, determines the frequency of the signal produced by the ring oscillator 225. The current source 220 is controlled by a programmable current mirror 206 and a voltage-to-current converter 203. In addition to the current provided by the source 220, the frequency of the oscillatory signal is determined by a group of switchable capacitors, 235, which may be selectively coupled to the ring oscillator circuitry 225 in response to the signal SLOW.

The following is a more detailed description of the circuitry shown in FIG. 2. The control voltage for the VCO 102 is applied to the terminal VCOIN by the loop filter as set forth below in reference to FIG. 4. This control voltage signal is applied to the gate electrode of a transistor 204 which is configured, with a resistor 202, as the voltage to current converter 203. The current provided at the source electrode of the transistor 204 is approximately proportional to the voltage applied to the terminal VCOIN.

The source electrode of the transistor 204 is coupled to the input leg of the current mirror 206. All of the current provided by the transistor 204 is sunk through the transistors 205 and 208 which constitute the input leg of the current mirror 206. The current mirror 206 is configured with three output legs coupled in parallel. The transistors 207 and 210 form the first output leg and are configured to sink the same amount of current as is passed through the input leg of the current mirror 206. The transistor pairs 212, 214 and 216, 218 form the second and third output legs of the current mirror 206. The second and third output legs of the current mirror 206 sink, respectively, the same current and twice the current as the input leg but only when their respective control signals, D0 and D1, are active. Thus, by using the control signals D0 and D1, the current mirror 206 may be conditioned to sink one, two, three or four times the current provided by the voltage-to-current converter 203.

The parallel output legs of the current mirror 206 are coupled to the input leg of a second current mirror 220. The output leg of the current mirror 220 is configured to provide the same amount of current to the ring oscillator 225 as is drawn from the input leg of the current mirror 220 by the current mirror 206. The current, IVCO, provided by the current mirror 220 is the operational supply current for the ring oscillator 225.

The ring oscillator 225 is configured as five identical CMOS logic inverter circuits 222, 224, 226, 228, and 230 coupled in a ring. The period of the signal produced by the oscillator is approximately equal to twice the propagation delay through any one of the inverters. This propagation delay is determined by the amount of time needed to charge the combined gate capacitances of the two transistors which constitute an inverter from their present potential to a potential which switches the respective conductivities of the two transistors, thereby inverting the output signal of the inverter. The amount of time required to charge the gate capacitances, in turn, depends on the amount of current which is provided to the drain electrodes of the P-channel transistors of each of the inverter circuits. At very low frequencies, when its P-channel transistor is turned on, each inverter provides either one-half or one-third of this current to the coupled gate electrodes of the following inverter. The amount of steady-state current provided depends on the number of P-channel transistors that are turned on at any given time.

At normal operating frequencies, however, charge stored in parasitic capacitances (not shown) at the drain electrode of the output leg of the current mirror 220 and at the source electrode of the p-channel transistors of each of the inverters 222 through 230 produce a transient current flow which dominates the steady-state current flow described above. At normal operating frequencies, therefore, it is the magnitude of the transient current that determines the switching speed of the inverters and thus the frequency of the signal provided by the oscillator 225. The magnitude of this transient current depends upon the magnitude of the current provided by the source 220 and the amount of time it is allowed to charge the parasitic capacitances. Thus, as the current provided by the source 220 increases, so does the frequency of the signal provided by the oscillator 225.

For any given configuration of transistors in the CMOS inverters of the ring oscillator 225, the frequency of the oscillator may be varied over a predetermined range. The upper bound of this range is defined by the maximum current that can be safely provided by the current mirror 220. The lower boundary is defined by the minimum current for which the potential levels of the output signal provided by the ring oscillator 225 are significantly greater than the level of electrical noise in the output signal. The output level of the oscillator defines its gain in the PLL. Gain is a function of the frequency of the oscillatory signal.

Since the potential level of the logic-one state relative to the logic-zero state of the output signal depends on the current provided by the current mirror 220 and, since the frequency of the oscillator depends on the gate capacitance of each of the inverters, one way to reduce the frequency of the oscillator while keeping its output levels relatively high would be to increase the gate capacitance of each of the inverters.

To this end the exemplary VCO circuitry includes a group of N-channel transistors 234 which are configured as capacitors relative to ground (VSS) and a group of P-channel transistors which are configured as analog gates to selectively couple the capacitors 234 in parallel with the gate capacitances of the respective P-channel transistors of each of the inverters 222, 224, 226, 228 and 230.

In addition to allowing the ring oscillator 225 to operate in different ranges of frequencies, the combination of the programmable current source, formed by the current mirrors 206 and 220, and the switchable gate capacitance changes the functional relationship between the gain of the VCO 102 and the frequency of the oscillatory output signal. This is an important aspect of the design since the gain of the VCO 102 contributes to the gain of the PLL which, in part, determines how well the loop holds a preselected frequency and how well it responds to contaminating noise signals.

It is contemplated that there may be some overlap in the frequency ranges of the VCO 102 with and without the capacitors 234. This overlap may be used to select a particular gain/frequency combination for the VCO to fit a particular application of the dot clock generator.

Figure 3A:
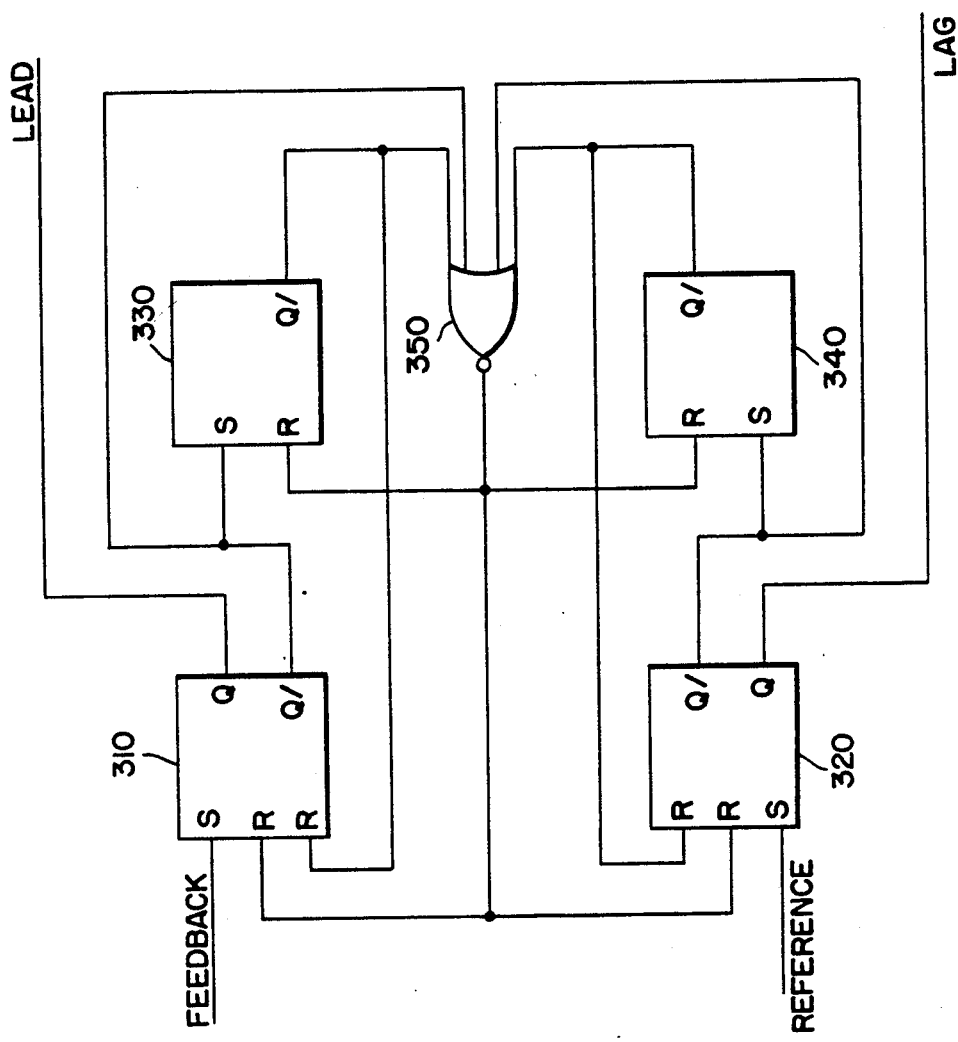
FIG. 3a (prior art) is a schematic diagram of a type IV phase detector.

FIG. 3a, labeled PRIOR ART, is a circuit diagram of a type IV phase-frequency detector. This circuit includes four R-S flip-flops 310, 320, 330 and 340 and a four-input NOR gate 350. The flip-flops 310, 320, 330 and 340 operate as conventional R-S flip-flops except that when both the R and S input signals are made active, the state of the flip-flop switches from active to inactive or from inactive to active.

The operation of the circuit for the instance in which the FEEDBACK signal leads the REFERENCE signal is described below. The operation of the circuit when the REFERENCE signal leads the FEEDBACK signal may be understood by switching the roles of the flip-flops 310 and 320 and of the flip-flops 330 and 340.

When both the FEEDBACK and REFERENCE signals are inactive, the flip-flops 310 and 320 are reset (Q inactive, Q/ active) and the flip-flops 330 and 340 are set (Q active, Q/ inactive). In this configuration, an active signal is applied to one of the R input terminals of each of the flip-flops 310 and 320. When the signal FEEDBACK becomes active, the state of the flip-flop 310 is toggled causing the signal LEAD to become active and the signal Q/ to become inactive. Thus, the flip-flop 310 has an active signal applied to its S input terminal and inactive signals applied to both of its reset input terminals.

When the signal REFERENCE becomes active, the state of the flip-flop 320 is toggled causing the signal LAG to become active and the Q/ output signal of the flip-flop 320 to become inactive. When this occurs, all of the input signals applied to the NOR gate 350 are inactive, causing the output signal of the NOR gate 350 to become active. The NOR gate 350 applies an active signal to the R input terminals on the flip-flops 310, and 320, causing them to toggle their states. The NOR gate 350 also applies an active signal to the R input terminals of the flip-flops 330 and 340, which resets these flip-flops. However, when the flip-flops 310 and 320 are toggled, they cause active signals to be applied to the S input terminals of the flip-flops 330 and 340. These signals toggle the states of these flip-flops, returning the phase-frequency detector to its original state.

In a conventional PLL, the signals LEAD and LAG are applied to a charge pump, such as the charge pump 116 shown in FIG. 1. In response to an active LEAD signal, the charge pump 116 is conditioned to act as a current source to the PLL loop filter (not shown). In response to an active LAG signal, the charge pump 116 acts as a current sink to the loop filter. Since the loop filter integrates the charge applied to its input terminal, the active LEAD signal tends to increase the potential provided by the filter while the active LAG signal tends to decrease the potential.

Figure 4:
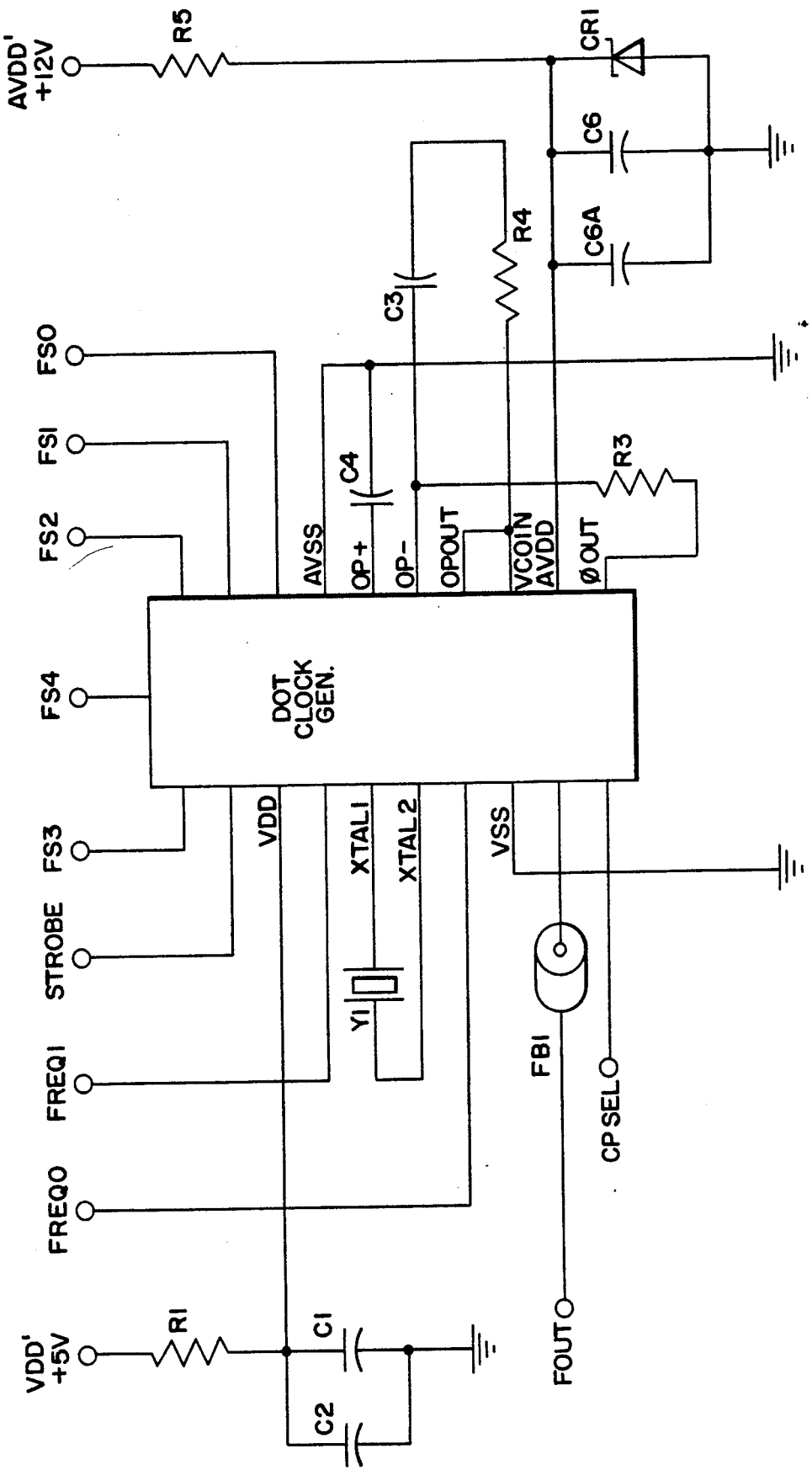
FIG. 4 is a schematic diagram, partly in block diagram form, of a clock generator circuit which includes the integrated circuit shown in FIG. 1.

In theory, a frequency-phase detector such as the one shown in FIG. 4 changes the potential provided by the loop filter to the VCO until the feedback and reference signals exactly coincide in both frequency and phase. In practice, however, the exact adjustment of the frequency and phase of the signal provided by the VCO is not a simple feat.

When the detector shown in FIG. 4 is used, for example, decreasing phase errors produce output pulse widths of either the signals LEAD or LAG that decrease down to a certain minimum value. As the phase errors decrease further, no output pulses are produced by the phase detector. The effect of this minimum detectable phase error is to cause the signal provided by the VCO to jitter about its desired value. As it approaches the value at which the FEEDBACK and REFERENCE signals would coincide, the adjustment stops, allowing the VCO to drift past this optimal value. Eventually, the frequency of the signal provided by the VCO drifts far enough to cause the phase-frequency detector to detect an error, causing an adjustment in a sense opposite to the first sense. In this manner, the frequency of the signal provided by the VCO dithers about its optimal value. This dithering of the dot clock frequency may produce an annoying jittering or swaying of the image provided by a high-resolution graphics display.

Figure 3B:
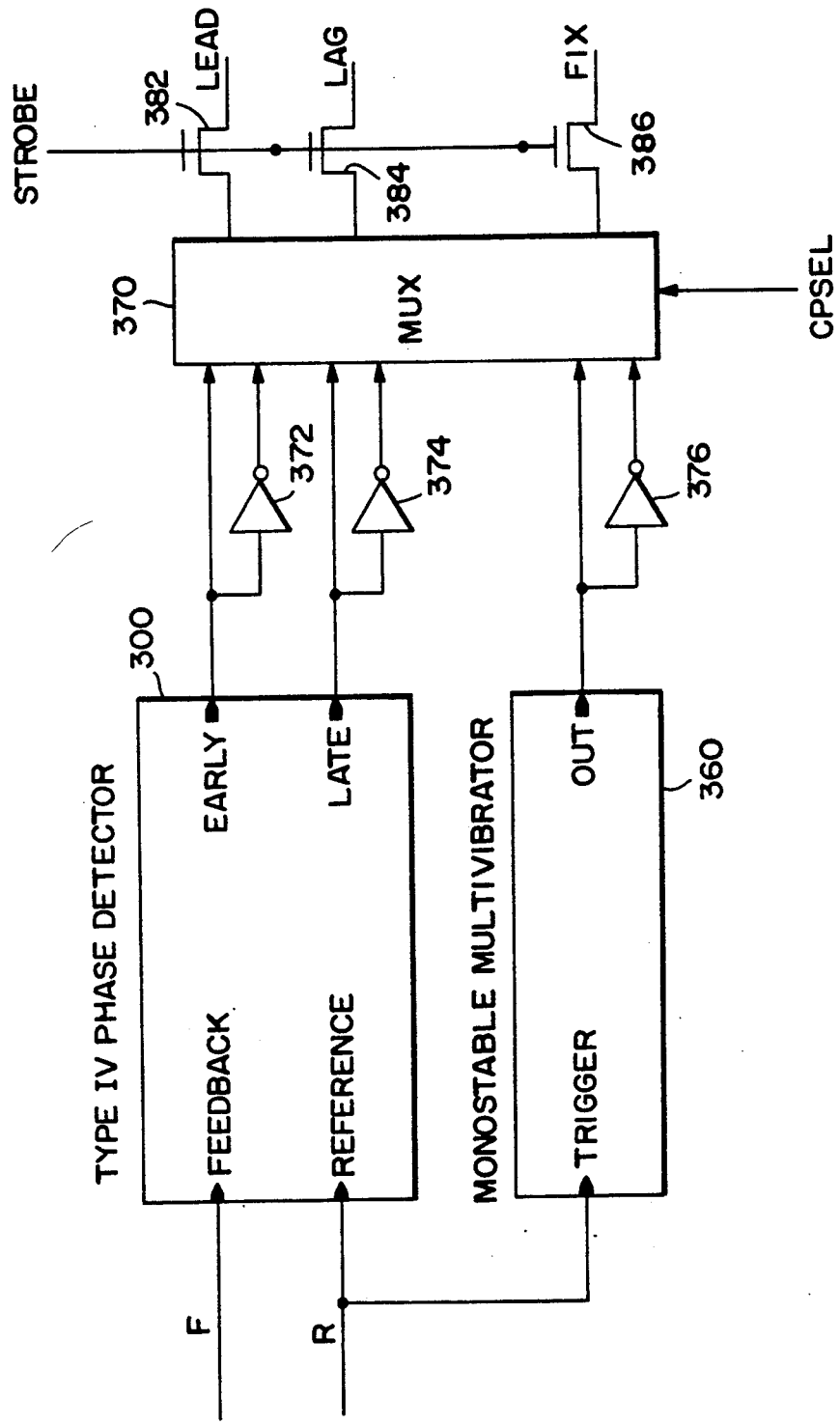
FIG. 3b is a block diagram, partly in schematic diagram form, of a phase comparator suitable for use in the circuitry shown in FIG. 1.
Figure 3C:
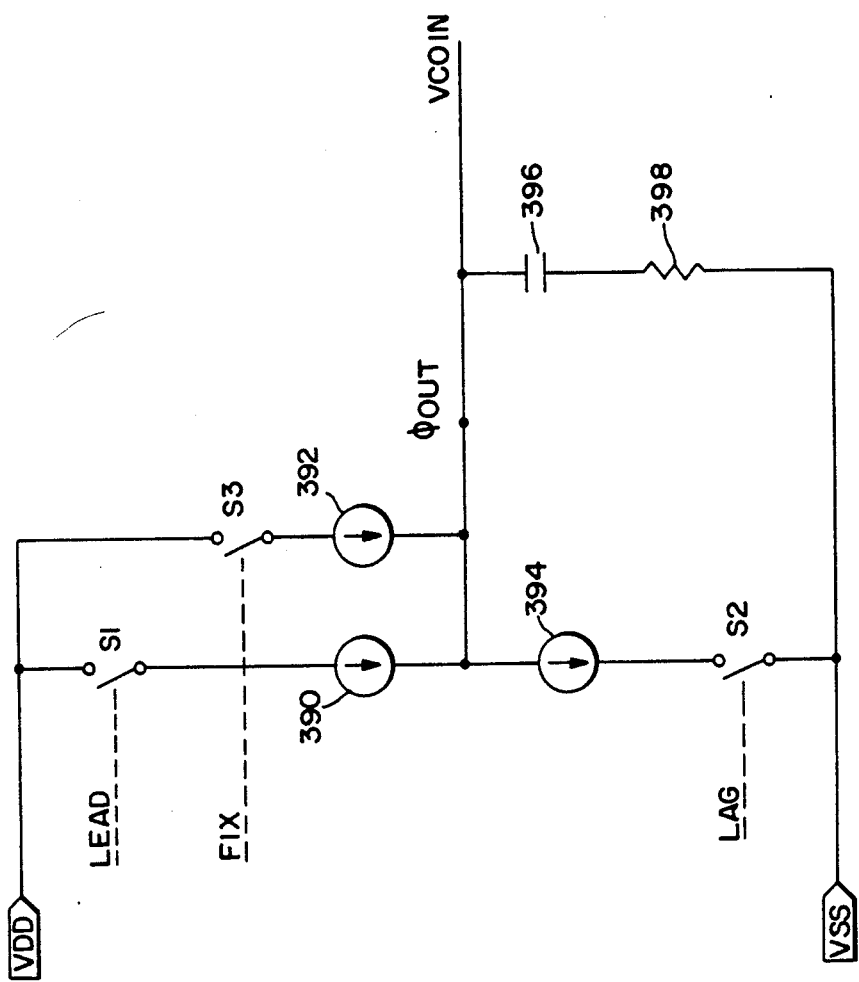
FIG. 3c is a schematic diagram of a charge pump and loop filter suitable for use in the circuitry shown in FIG. 1.

FIGS. 3b and 3c show modifications to the conventional configuration of a PLL which substantially eliminate any jittering or dithering of the frequency of the dot clock signal. In FIG. 3b, a type IV phase detector 300, which may be identical to that described above in reference to FIG. 3a, is configured in parallel with a monostable multivibrator (one-shot) 360. The one-shot 360 is configured to be triggered by the active-going edge of the reference signal R provided by the programmable counter 114, shown in FIG. 1. The output signal of the one-shot 360 is a fixed-width pulse. In this exemplary embodiment of the invention, the pulse width is fixed at 100 nanoseconds (ns).

Although, in the exemplary embodiment of the invention, the one-shot 360 is configured to be responsive to the reference signal, R, it is contemplated that the circuit could also be configured such that the one-shot 360 produced its output pulse signal responsive to a transition of the feedback signal, F.

The output signals EARLY and LATE from the phase detector 360 and the output signal OUT from the one-shot 360 are applied directly and through respective inverters 372, 374 and 376 to a multiplexer 370. The multiplexer 370 is responsive to the signal CPSEL to provide either the normal or inverted signals as the respective signals LEAD, LAG and FIX.

The signals provided by the multiplexer 370 are applied to respective pass-transistor gates 382, 384 and 386 which are all controlled by the signal STROBE. When the signal STROBE is active, the transistors 382, 384 and 386 are rendered non-conductive, so that a high-impedance is presented to the charge pump 116, shown in FIG. 1. These pass transistors implement the feature of the phase comparator, described above, in which the output of the phase comparator 110 is placed in a high impedance state when the frequency of the signal produced by the dot clock generator is changed.

The signals LEAD, LAG and FIX produced by the phase comparator 110, shown in FIG. 1, are applied to the charge pump 116. FIG. 3c shows circuitry which may be used as the charge pump 116 and the loop filter (not shown in FIG. 1). The loop filter shown in FIG. 3c (capacitor 396 and resistor 398) is greatly simplified for explanatory purposes. In an actual implementation, a loop filter such as that described below in reference to FIG. 4 may be preferred.

The charge pump shown in FIG. 3c includes three constant current sources 390, 392 and 394 which are controlled by respective switches S1, S2 and S3. The current sources 390 and 392 are configured to provide current to the node $\phi_{OUT}$ when the respective signals LEAD or FIX are active and the current source 394 is configured to act as a current sink, drawing current from the node $\phi_{OUT}$ when the signal LAG is active.

The node $\phi_{OUT}$ is coupled to a loop filter which includes the capacitor 396 and resistor 398 and to the control input terminal, VCOIN, of the VCO 112. When either of the switches S1 or S3 is closed and switch S2 is open, charge flows into the capacitor 396, increasing the control potential applied to the VCO 112. When the switch S2 is closed and switches S1 and S3 are open, however, charge is drained from the capacitor 396, decreasing the control potential applied to the VCO 112.

Since the switch S3 is closed for a fixed amount of time at each active-going transition of the reference signal, the control potential provided to the VCO 112 is constant only if the signal FEEDBACK lags the signal REFERENCE by an interval equal to the pulse width of the signal FIX. In this instance, both of the switches S3 and S2 are closed and there is no net current flow to or from the capacitor 396. This fixed lag of the feedback signal relative to the reference signal substantially eliminates any jitter in the frequency of the signal produced by the VCO 112. While the phase detector 300, shown in FIG. 3b, cannot produce an arbitrarily narrow pulse it can produce a finite pulse having a pulse width that is arbitrarily close to the width of the pulse produced by the one-shot 360.

FIG. 4 is a schematic diagram, partially in block diagram form, of a video clock circuit built around the dot clock generator described above in reference to FIGS. 1 through 3c. Typical component values for this circuit are given in the following Table.

TABLE

| Component | Value |
|---|---|
| C1, C6A | 2.2 mfd |
| C2, C4, C6 | 0.047 mfd |
| C3 | 1.0 mfd |
| R1 | 10 ohm |
| R3 | 100K ohm |
| R4 | 150 ohm |
| R5 | 620 ohm |
| CR1 | 5.1 volt Zener |
| FB1 | ferrite bead Ferroxcube 56-590-65/4B |
| Y1 | 14.31818 Mhz resonant Crystal |

In this circuit, the internal operational amplifier 118 is used as a part of an active filter which also includes the capacitor C3 and the resistors R3 and R4. The dot clock generator IC uses two sources of operational potential, VDD for digital circuitry and AVDD for analog circuitry and a source of reference potential (e.g. ground). Capacitors C1 and C2 and the resistor R1 condition the source VDD and capacitors C6 and C6A, resistor R5 and Zener diode CR1 condition the source AVDD. The ferrite bead FB1 limits high frequency harmonic components of the dot clock signal to minimize problems in meeting the FCC electromagnetic interference standards.

In operation, the terminals FS0 through FS3 are coupled to a port which provides the address input signal to the memory 120 shown in FIG. 1. When a new address value has been established, the STROBE signal is pulsed to effect the frequency change. This clock frequency may be internally generated by programming the prescaler 106 and the counters 108 and 114, or it may be an external clock signal, applied via the terminals FREQ0 and FREQ1.

As set forth above, the circuit shown in FIG. 4 may be configured to generate a dot clock signal that is synchronized to, for example, a system clock signal. In this instance, the connection between the resonant crystal and the terminal XTAL2 would be broken and Y1 would be replaced by a 0.047 mfd capacitor (not shown). The system clock signal would be applied to the unconnected end of the 0.047 mfd capacitor.

While the invention has been described in terms of an exemplary embodiment, it is contemplated that it may be practiced as outlined above with modifications within the spirit and scope of the appended claims.

The invention claimed is:

1. Apparatus for use in generating multiple clock signals, comprising:
   a source of reference oscillatory signal;
   first frequency dividing means for dividing said reference oscillatory signal in frequency by an amount determined by a first control signal;
   variable oscillator means having a control input terminal and responsive to a second control signal applied thereto for generating a variable frequency oscillatory signal;
   second frequency dividing means for dividing said variable frequency oscillatory signal, in frequency, by an amount determined by a third control signal;
   phase comparison means for producing an output signal representing the difference in phase between the respective output signals of said first and second frequency dividing means and being responsive to a fourth control signal for producing said output signal indicating no difference in phase, irrespective of the output signals of said first and second frequency dividing means;
   means coupling the output signal of said phase comparison means to the control input terminal of said variable oscillator means; and
   control means, for generating said first, third and fourth control signals to change the frequency of the signal provided by said variable oscillator means.

2. The apparatus set forth in claim 1 wherein said control means includes a programmable memory for holding values of said first, third and fourth control signals and said apparatus further includes means for programming said programmable memory.

3. The apparatus set forth in claim 1 wherein:
   said first control signal includes first and second component control signals; and
   said first frequency dividing means includes;
   prescaling means, responsive to said first component signal, for selectively dividing said variable frequency oscillatory signal in frequency by a factor of two to produce a pulse output signal; and
   signal pulse counting means, responsive to said second component control signal, for producing one output pulse for every integer N pulses of the signal provided by said prescaling means, where N is the value of said second component control signal.

4. The apparatus set forth in claim 1 further including means for coupling said apparatus to a source of operating potential and to a source of reference potential, wherein said phase comparison means is responsive to a further control signal being in first and second states to produce said output signal referenced to said source of operating potential and said source of reference potential, respectively.

5. The apparatus set forth in claim 1 further including amplifier means, configured to be selectively coupled between said phase comparison means and said variable oscillator means.

6. Apparatus for use in generating multiple clock signals, comprising:
   a source of reference oscillatory signal;
   variable oscillator means, having a control input terminal and responsive to a frequency control signal applied thereto for generating a variable frequency oscillatory signal;
   phase comparison means for producing an output signal representing a variance from a predetermined phase relationship between said reference oscillatory signal and said variable oscillatory signal, said phase comparison means comprising:
   phase detecting means for producing a first pulse signal having a pulse width representing the difference in time between the occurrence of corresponding predetermined transitions of said reference oscillatory signal and said variable oscillatory signal, respectively;
   means, responsive to one of said reference oscillatory signal and said variable oscillatory signal for producing a second pulse signal having a substantially fixed pulse width on the occurrence of the predetermined transition of said one signal; and
   means for combining said first and second pulse signals in a manner allowing said second pulse signal to substantially cancel said first pulse signal when said reference oscillatory signal and said variable oscillatory are in said predetermined phase relationship.

7. The apparatus set forth in claim 6 wherein:
   said phase detector produces said first pulse signal when the phase of said variable oscillatory signal lags the phase of said reference oscillatory signal, and produces a third pulse signal when the phase of said variable oscillatory signal leads the phase of said reference oscillatory signal; and
   said means for combining includes means for combining said third pulse signal with said first and second pulse signals to produce said combined output signal.

8. The apparatus set forth in claim 6 wherein said phase detector is a type IV frequency-phase detector and said means for producing said second pulse signal includes a monostable multivibrator.

9. Apparatus for use ian generating multiple-clock signals, comprising:

a source of reference oscillatory signal;

variable oscillator means, having a control input terminal and responsive to a frequency control signal applied thereto for generating a variable frequency oscillatory signal, said variable oscillator means including further means, responsive to a further control signal, for changing the range of frequencies of the variable oscillatory signal that are produced in response to a predetermined range of values of said frequency control signal; and phase comparison means for producing an output signal representing a variance from a predetermined phase relationship between said reference oscillatory signal and said variable oscillatory signal.

10. The apparatus set forth in claim 9 wherein:

said variable oscillator means includes a current controlled oscillator; and said means responsive to said further control signal includes means for changing the amount of current provided to said current controlled oscillator in response to the predetermined range of values of said frequency control signal.

11. The apparatus set forth in claim 10 wherein:

said variable oscillator means has a gain which exhibits a first functional relationship with respect to the frequency of said variable oscillatory signal; and the means for changing the range of frequencies of the variable oscillatory signal in response to said further control signal also changes the gain of said variable oscillator means to have a second functional relationship with respect to the frequency of said variable oscillatory signal.

12. The apparatus set forth in claim 9 wherein:

said variable oscillator means includes a current controlled ring oscillator which includes a plurality of inverter circuits each including a metal-insulator-semiconductor (MIS) transistor having a principle conduction path between first and second electrodes and a third electrode for controlling the conductivity of said principle conduction path; and said further means includes means for changing the operating characteristics of each of said transistors by changing the capacitance between said third electrode and at least one of said first and second electrodes.

13. A method for generating a signal representing a variance from a predetermined phase relationship between a reference oscillatory signal and a variable oscillatory signal comprising the steps of:

producing a first pulse signal having a pulse width representing the difference in time between the occurrence of corresponding predetermined transitions of said reference oscillatory signal and said variable oscillatory signal, respectively;

producing a second pulse signal having a substantially fixed pulse width on the occurrence of a predetermined transition of one of said reference oscillatory signal and said variable oscillatory signal; and combining said first and second pulse signals in a manner allowing said second pulse signal to substantially cancel said first pulse signal when said reference oscillatory signal and said variable oscillator are in said predetermined phase relationship.

14. Apparatus for use in generating multiple clock signals, comprising:

a source of reference oscillatory signal;

first frequency dividing means for dividing said reference oscillatory signal in frequency by an amount determined by a first control signal;

variable oscillator means, having a control input terminal and responsive to a second control signal applied thereto for generating a variable frequency oscillatory signal;

second frequency dividing means for dividing said variable frequency oscillatory signal, in frequency, by an amount determined by a third control signal;

phase comparison means for producing an output signal representing the difference in phase between the respective output signals of said first and second frequency dividing means and being responsive to a fourth control signal to produce said output signal indicating no difference in phase, irrespective of the output signals of said first and second frequency dividing means;

filter means for generating said second control signal from the output signal of said phase comparison means and for applying said second control signal to the control input terminal of said variable oscillator means; and control means, for generating said first, third and fourth control signals to change the frequency of the signal provided by said variable oscillator means, holding values of said first, third and fourth control signals; wherein said apparatus further includes means for programming said programmable memory.

15. The apparatus of claim 14, wherein said filter means includes amplifier means, configured to be selectively coupled between said phase comparison means and said variable oscillator means, for generating said second control signal from the output signal of said phase comparison means.

* * * * *

UNITED STATES PATENT AND TRADEMARK OFFICE
CERTIFICATE OF CORRECTION

PATENT NO. : 5,036,216

DATED : July 30, 1991

INVENTOR(S) : Jere W. Hohmann et al.

It is certified that error appears in the above—identified patent and that said Letters Patent is hereby corrected as shown below:

At column 11, line 63: change "first, third and fourth" to --first and third--.

At column 11, line 67: change "first" to --third--.

At column 12, line 1: change "first" to --second--.

At column 13, line 1: change "ian" to --in--.

Signed and Sealed this

Twenty-seventh Day of April, 1993

Attest:

MICHAEL K. KIRK

Attesting Officer

Acting Commissioner of Patents and Trademarks